(12) United States Patent
Govzman et al.

(10) Patent No.: US 6,474,712 B1
(45) Date of Patent: Nov. 5, 2002

(54) GRIPPER FOR SUPPORTING SUBSTRATE IN A VERTICAL ORIENTATION

(75) Inventors: Boris I. Govzman, Sunnyvale, CA (US); Manoocher Birang, Los Gatos, CA (US); Michael Sugarman, San Francisco, CA (US); Anwar Husain, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/559,889

(22) Filed: Apr. 26, 2000

Related U.S. Application Data (60) Provisional application No. 60/134,377, filed on May 15, 1999.

(51) Int. Cl.[7] .............................. B66C 1/00; B25J 11/00; B25J 15/00
(52) U.S. Cl. .......................... 294/106; 414/941; 901/30; 901/39
(58) Field of Search ............................... 294/106, 31.1, 294/108, 109, 118, 902, 104, 1.1; 901/31, 33, 39; 414/941, 217

(56) References Cited

U.S. PATENT DOCUMENTS

| | | | | |
|---|---|---|---|---|
| 1,807,360 A | * | 5/1931 | Wehr | 294/106 |
| 3,219,375 A | | 11/1965 | Van Pelt | 294/16 |
| 3,918,756 A | * | 11/1975 | Saville et al. | 294/31.2 |
| 4,452,480 A | * | 6/1984 | Maier et al. | 294/104 |
| 4,452,481 A | * | 6/1984 | Williams | 294/902 |
| 4,586,743 A | * | 5/1986 | Edwards et al. | 414/941 |
| 4,715,637 A | * | 12/1987 | Hosoda et al. | 414/941 |
| 4,717,190 A | * | 1/1988 | Witherspoon | 414/941 |
| 4,848,814 A | * | 7/1989 | Suzuki et al. | 901/30 |
| 5,110,167 A | * | 5/1992 | Friend | 294/1.1 |
| 5,168,168 A | * | 12/1992 | Luecke | 294/902 |
| 5,642,298 A | * | 6/1997 | Mallory et al. | 414/941 |
| 5,656,088 A | | 8/1997 | Sugimoto et al. | 118/423 |
| 5,749,469 A | * | 5/1998 | Williams | 294/31.1 |
| 5,938,902 A | * | 8/1999 | Nguyen et al. | 414/941 |
| 6,260,897 B1 | * | 7/2001 | Carano | 294/902 |

FOREIGN PATENT DOCUMENTS

| | | | | |
|---|---|---|---|---|
| DE | 42 32 902 A1 | 3/1994 | | |
| EP | 0 198 501 | 10/1986 | | |
| EP | 0 228 973 | 7/1987 | | |
| EP | 0 287 384 | 10/1988 | | |
| JP | 362252147 | * | 11/1987 | 414/941 |
| JP | 402288247 | * | 11/1990 | 414/941 |
| SU | 0722758 | * | 3/1980 | 294/902 |

* cited by examiner

Primary Examiner—Donald P. Walsh
Assistant Examiner—Paul T. Chin
(74) Attorney, Agent, or Firm—Dugan & Dugan (57) ABSTRACT

A gripper assembly is provided which supports a substrate in a vertical orientation. The gripper assembly's end effectors contact only the edge of the substrate. In a first aspect the end effectors each comprise a first pair of opposed surfaces and an second pair of opposed surfaces, all of which simultaneously contact the substrate, holding the substrate in a clamp-type manner. In a second aspect the end effectors each comprise a lower pair of opposed surfaces which simultaneously contact the substrate, and an upper pair of opposed surfaces, larger than the thickness of the substrate, which limit the substrate from horizontal tilting. In the second aspect the end effectors can close at a first elevation where they do not contact the substrate, and can then elevate to gently contact and support the substrate in a pocket-like manner. In a third aspect one of the end effectors has two pairs of opposed surfaces which simultaneously contact the substrate, and the other end effector has two pairs of opposed surfaces which limit the substrate from horizontal tilting. In any aspect no moving parts are required to limit the substrate's vertical and horizontal movement. In a further aspect, fingers to which the end effectors are coupled, are bent so that the gripper is not positioned above the substrate.

24 Claims, 9 Drawing Sheets

GRIPPER FOR SUPPORTING SUBSTRATE IN A VERTICAL ORIENTATION

This application claims benefit of provisional application Ser. No. 60/134,775 filed May 15, 1999.

BACKGROUND OF THE INVENTION

When designing an automated semiconductor substrate handler, three main concerns prevail; 1) substrate handler reliability; 2) substrate handler particle generation and potential for substrate contamination; and 3) substrate handler size. Each of these concerns is essentially aimed at reducing costs associated with damaged or defective substrates. Increasing substrate handler reliability prevents substrate damage which can occur when a substrate is incorrectly grasped, etc., and prevents downtime associated with repair and/or recalibration. Reducing particle generation helps reduce defects which result when particles contact substrate surfaces, and reducing substrate handler size allows processing chamber openings to be smaller and to thereby reduce the possibility of particle entry to the chamber and the possibility of substrate contamination thereby.

A major source of particles results when a substrate slides along the surface of the substrate handler's end effector. Accordingly, after a wafer is placed/loaded onto an end effector, a pin or other holding mechanism conventionally moves into place to secure the substrate and prevent the substrate from sliding against the end effector during transport. However sliding and the particles that result therefrom, may occur as part of the loading process. Further, the holding mechanisms, being moving parts themselves, can generate particles and can introduce reliability issues, increasing substrate handler costs. Moreover, during the entire load and transfer process, particles and other contaminants may collect on the substrate or between the end effectors and the substrate.

Accordingly, a need exists for an improved substrate handler, and particularly for a substrate handler having an improved end effector which will reduce substrate sliding and the associated need for moving parts to control substrate sliding. Such a substrate handler and end effector should be streamlined, and should reduce the probability of contaminant contact with substrate surfaces and/or the probability of trapped contaminants between the end effector and the substrate.

SUMMARY OF THE INVENTION

The present invention provides an inventive gripper assembly having a pair of fingers operatively coupled to the gripper so as to move between an open and a closed position; each finger has an end effector coupled thereto, and adapted to support a vertically oriented substrate therebetween. Each end effector has a first pair of opposed surfaces and a second pair of opposed surfaces. Each pair of opposed surfaces is adapted either to simultaneously contact the edge of a vertically oriented substrate supported by the end effector, (clamp-type contact) or to limit horizontal movement of a vertically oriented substrate supported by the end effectors (pocket-type contact). Each of the opposed surfaces preferably does not move relative to the other. A pair of opposed surfaces that do not move relative to each other is referred to herein as unitary, whether made of one or more pieces. Preferably, both the first and second opposed surfaces are radiused to mimic the circumference of the wafer so as to deter fluid and contaminants from collecting between the substrate and the surfaces of the end effector.

In operation, the end effectors are positioned on opposite sides of a vertically oriented substrate, and preferably pick up or grasp the substrate in either of the two manners described below. Specifically, in the case of a gripper assembly configured for clamp-type contact, the end effectors are moved to a position at which the end effectors may stably support the vertically oriented substrate. Thereafter, the end effectors are closed such that the end effector's first and second pairs of opposed surfaces contact the substrate's edge and thereby support the substrate.

Similarly, in the case of a gripper assembly configured for pocket-type contact, the gripper assembly may simply close such that the two pairs of opposed surfaces positioned closest to the bottom edge of the substrate contact the substrate. Alternatively, the pocket-type end effectors may move to a position in line with the substrate, yet at an elevation below which the pair of opposed surfaces would contact the substrate when the end effectors are in a closed position. This elevation may be entirely below the substrate or anywhere below the substrate's horizontal diameter. Thereafter the closed pair of end effectors are elevated such that the end effectors' lower pairs of opposed surfaces contact and support the substrate via the substrate's edges. Note that a pocket type gripper need not have an open and closed position, as the gripper may pick up and deposit a substrate by raising and lowering around the substrate as will be apparent with reference to the detailed description of the preferred embodiments.

The clamp-type gripper is advantageous because it is able to grasp wafers that are within a relatively wide tolerance of a desired position, and thus reduces the time required for initial robot calibration and chamber alignment, as well as reducing the frequency and time required for recalibration and alignment.

The pocket-type gripper is advantageous because it reduces the risk of substrate damage. The pocket-type grippers close below the substrate forming a pocket, and then elevate such that the substrate gently contacts the bottom of the pocket (e.g., contacts the lower pair of opposed surfaces), and such that the upper pair of opposed surfaces surround the substrate and prevent the substrate from excessive tilting in the horizontal direction. Accordingly, the only force applied to the substrate is a purely vertical lifting force, which tends to generate fewer particles than do multidirectional forces. Further, because there is no external force opposing the vertical lifting force, the substrate is not acted on by external opposing forces, and is less likely to be damaged.

When the gripper assembly is configured such that the gripper is at a higher elevation than the end effectors, the fingers are preferably bent such that the gripper is positioned to the front, back or most preferably the side of the substrate rather than directly above the substrate. Thus, particles from the gripper are less likely to contaminate the substrate.

The end effectors of the inventive gripper assembly, whether clamp-type or pocket-type, preferably have no moving parts, and are therefore inexpensive and less likely to malfunction. Further, the absence of moving parts enable a streamlined design, which in addition to the fact that the gripper assembly grasps a substrate by the substrate's edges, allows the inventive gripper assembly to move substrates through narrow openings such as those found in semiconductor manufacturing equipment.

Because the inventive gripper assembly is streamlined and inexpensive, and because the gripper assembly experiences reduced calibration time, reduced particle generation, and reduced risk of substrate damage, a substrate handler employing the inventive gripper assembly is ideally suited for semiconductor applications. Moreover, because the inventive gripper assembly supports a substrate in a vertical orientation, contaminants are less likely to collect on the substrate's surfaces. Further contamination reduction may be achieved with the use of radiused end effector surfaces which are radiused to mimic the circumference of the wafer, and thus may minimize or eliminate contact with the front or back surface of the wafer and may contact only the beveled edge of the wafer.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1:
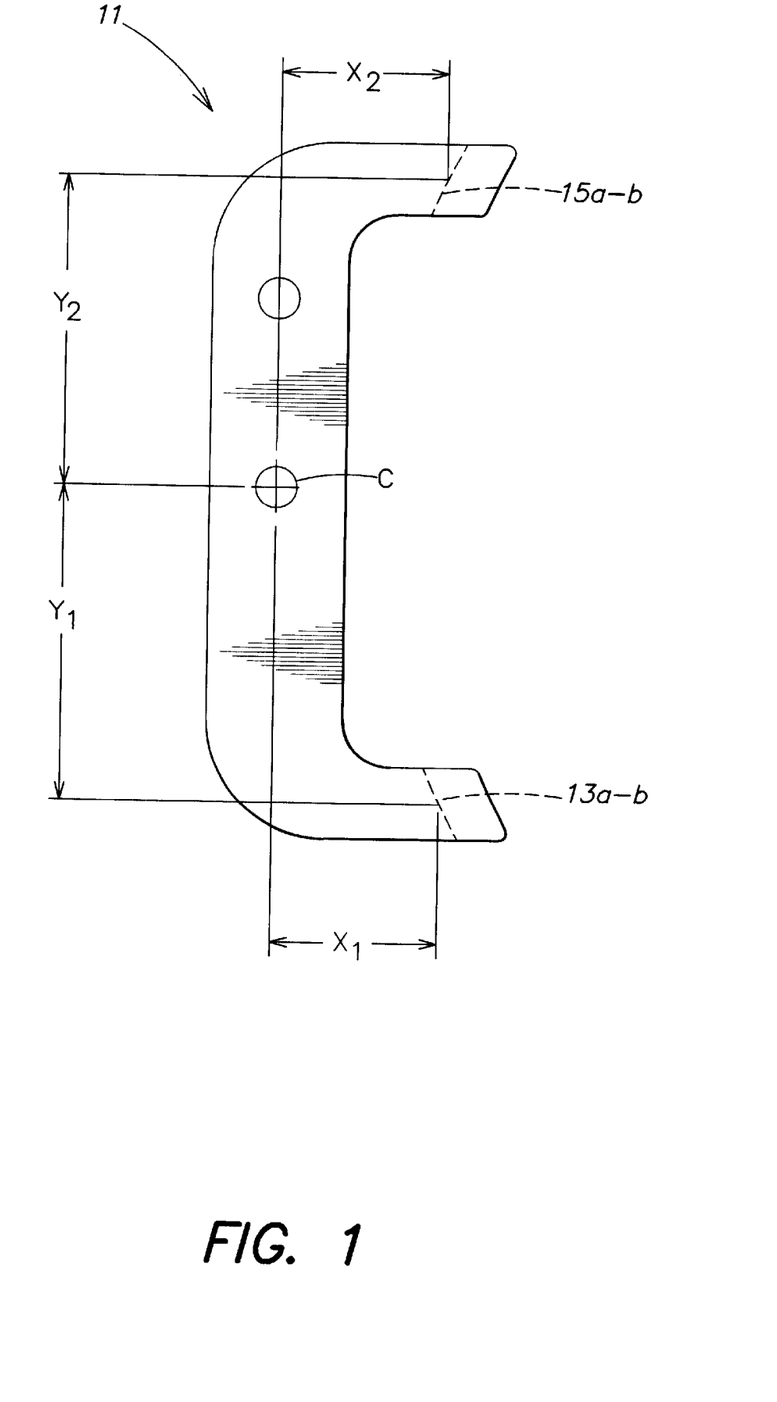
FIG. 1 is a side perspective view of a clamp-type end effector of a first aspect of the inventive gripper assembly.
Figure 1A:
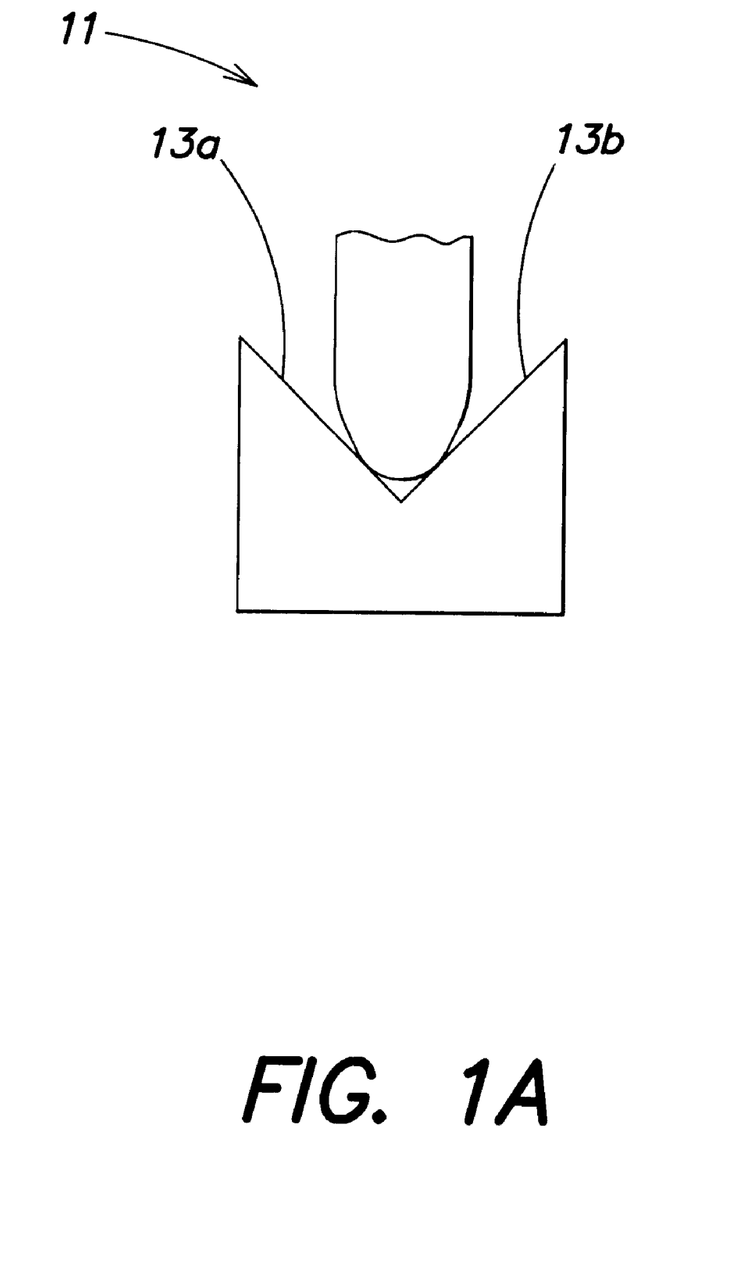
FIG. 1A is a cross-sectional view showing contact between a substrate and opposed surfaces of the end effector of FIG. 1.

FIG. 1 is a side perspective view of a clamp-type end effector 11 of a first aspect of the inventive gripper assembly. The clamp-type end effector 11 comprises a first pair of opposed surfaces 13a–b, adapted to simultaneously contact an edge of a vertically oriented substrate to be supported thereby (FIGS. 2A–B), and a second pair of opposed surfaces 15a–b adapted to simultaneously contact a vertically oriented substrate to be supported thereby. The first pair of opposed surfaces 13a–b and the second pair of opposed surfaces 15a–b preferably comprise a groove adapted to support a substrate S with minimum contact (e.g., via two opposing points), such as a "v" shaped groove, as shown in FIG. 1A. Preferably, to deter particles and fluid contaminants from being trapped between the first pair of opposed surfaces 13a–b and/or the second pair of opposed surfaces 15a–b, and the substrate surface, the first pair of opposed surfaces 13a–b and the second pair of opposed surfaces 15a–b are radiused to mimic the circumference of the wafer, and thus may minimize or eliminate contact with the front or back surface of the wafer and may contact only the beveled edge of the wafer, as shown in FIG. 1. Further, the first pair of opposed surfaces 13a–b and the second pair of opposed surfaces 15a–b are preferably unitary, thereby minimizing moving parts.

Figure 2A:
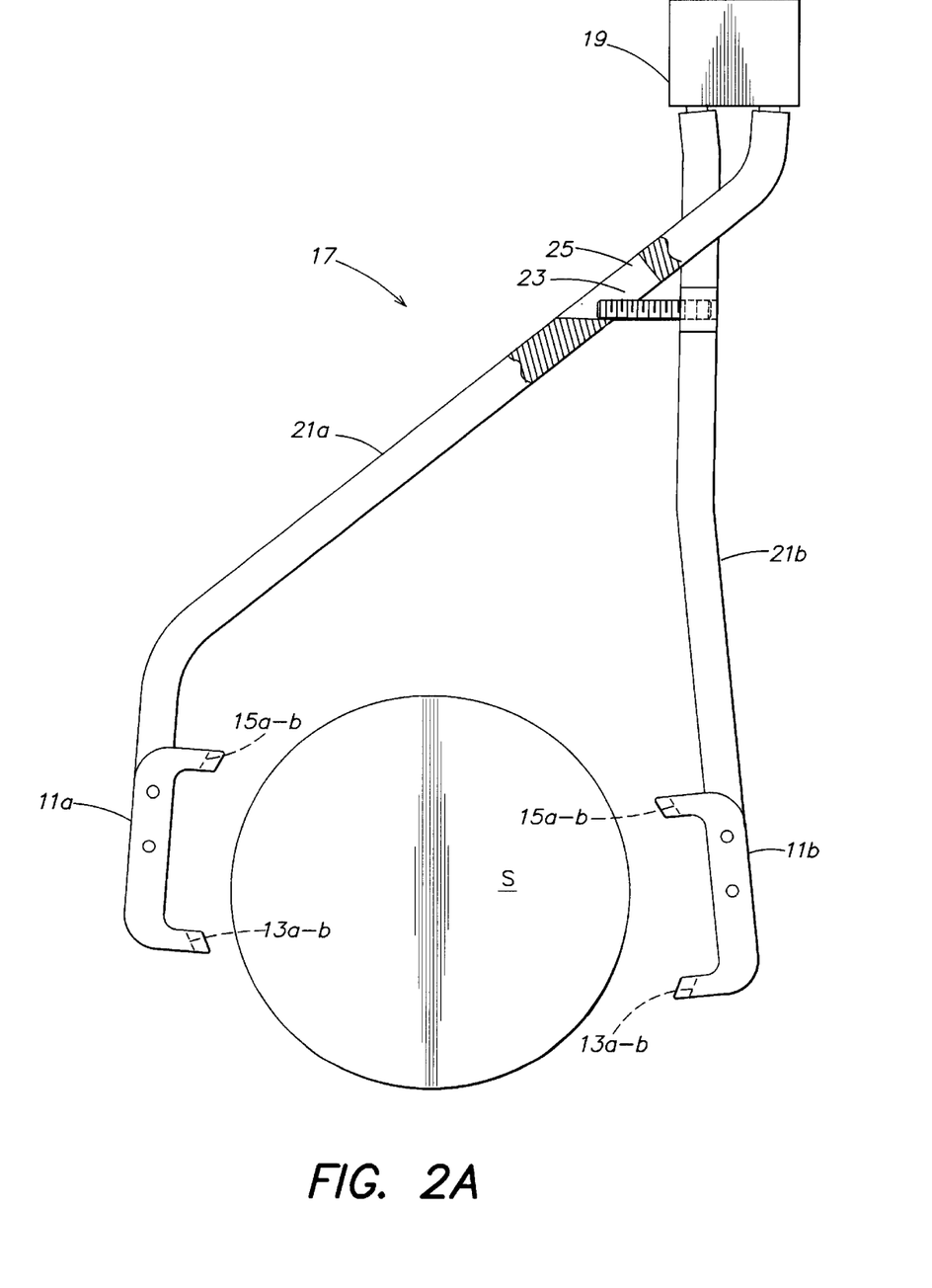
FIGS. 2A and 2B are front elevational views of a gripper assembly employing the clamp-type end effector of FIG. 1, showing the gripper assembly in an open and a closed position, respectively.
Figure 2B:
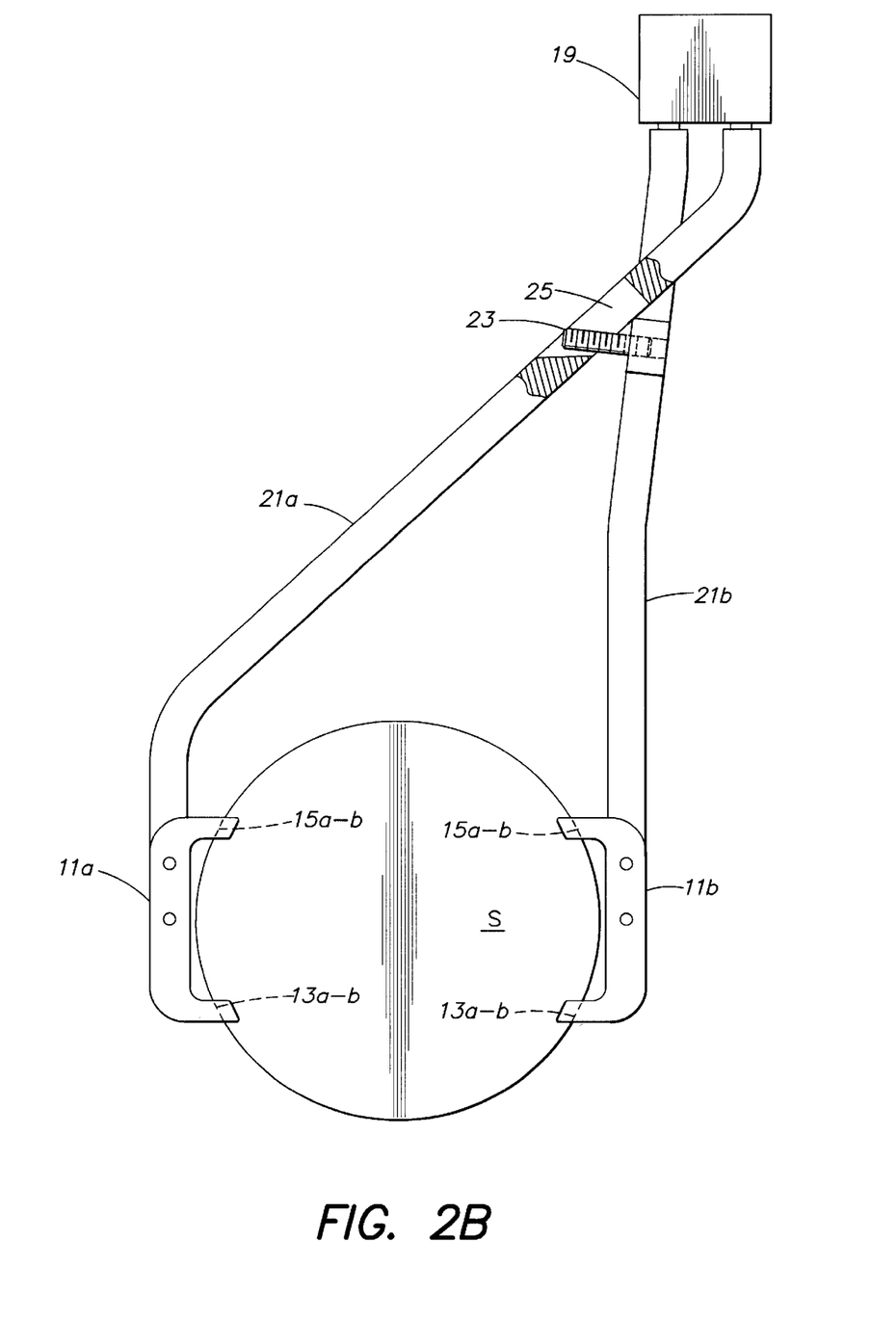

The first pair of opposed surfaces 13a–b and the second pair of opposed surfaces 15a–b preferably extend the same (with reference to FIG. 1 horizontal distance) distance x and the same (with reference to FIG. 1 vertical distance) distance y, from a point C which is to be centered on the substrate's diameter (e.g., in the configuration shown the point C is to be centered on the substrate's horizontal diameter), such that when the point C is centered along the diameter of a substrate (where the clamp-type end effector 11 provides maximum stability) the first pair of opposed surfaces 13a–b and the second pair of opposed surfaces 15a–b provide the only contact points with the substrate, and for maximum stability, contact the substrate at equal distances from the substrate's diameter, as shown in FIGS. 2A–B.

FIGS. 2A–B are front elevational views of a gripper assembly 17 which employs a pair of the end effector 11 of FIG. 1, and which show the gripper assembly 17 in an open and a closed position, respectively. The gripper assembly 17 comprises a gripper 19, a pair of fingers 21a–b operatively coupled to the gripper 19 so that the gripper 19 can move the pair of fingers 21a–b between an open and a closed position. Coupled to the ends of the pair of fingers 21a–b opposite the gripper 19, are a pair of clamp-type end effectors 11a–b, configured as described with reference to FIG. 1. The clamp-type end effectors 11a–b are coupled to the pair of fingers 21a–b so that the first end effector 11a's first pair of opposed surfaces 13a–b and second pair of opposed surfaces 15a–b are opposite the second end effector 11b's first pair of opposed surfaces 13a–b and second pair of opposed surfaces 15a–b, respectively.

Grippers for moving a pair of fingers between open and closed positions are well known in the art, and are therefore not described in detail herein. Similarly, although shown in a scissors linkage configuration, the pair of fingers 21a–b may be coupled in any manner to achieve open and closed positions. However, in the scissors linkage configuration shown, the distance between the clamp-type end effectors 11a–b in the open and closed position can be easily adjusted via a set screw 23 which controls relative movement between the pair of fingers 21a–b by sliding back and forth within a slot 25, as is known in the art.

When the pair of fingers 21a–b are configured in the scissors linkage, the gripper 19 moves the base of the pair of fingers 21a–b apart, causing the ends of the pair of fingers 21a–b to move apart thereby assuming an open position wherein the first pair of opposed surfaces 13a–b and the second pair of opposed surfaces 15a–b are positioned farther apart than the diameter of a substrate supported thereby (as shown in FIG. 2A). To assume the closed position, the gripper 19 moves the base of the pair of fingers 21a–b toward each other, causing the ends of the pair of fingers 21a–b to move toward each other to a position where the first pair of opposed surfaces 13a–b and the second pair of opposed surfaces 15a–b are positioned such that each of the first pair of opposed surfaces 13a–b and each of the second pair of opposed surfaces 15a–b contact the substrate S (as shown in FIG. 2B). Preferably, the lower of the two first pairs and the two second pairs of opposed surfaces are positioned where the substrate S is narrower than at its diameter (e.g., below the substrate's horizontal diameter or adjacent but off-set from the substrate's vertical diameter, etc.) Thus, due to the fact that the substrate's width increases as its diameter is approached, the substrate S cannot slide downwardly through the lower pair of opposed surfaces (e.g., with reference to FIG. 2 the first pair of opposed surfaces 13a–b)

In operation a substrate handler (not shown) having the gripper assembly 17 coupled thereto, moves the gripper assembly 17 to a position at which the clamp-type end effectors 11a–b can stably support the vertically oriented substrate S. The position at which the first pair of opposed surfaces 13a–b and the second pair of opposed surfaces 15a–b can stably support the substrate S varies depending on the specific configuration of the first pair of opposed surfaces 13a–b and the second pair of opposed surfaces 15a–b (e.g., the distances x and y to which the first pair of opposed surfaces 13a–b and the second pair of opposed surfaces 15a–b extend, whether equal or differing distances, etc.). However, the position at which the clamp-type end effectors 11a–b can stably support the substrate S, preferably positions the center C of the clamp-type end effector 11a–b at the diameter of the substrate S (e.g., as shown in FIGS. 2A–B the horizontal diameter). Thereafter, the gripper assembly 17 assumes the closed position such that the first pair of opposed surfaces 13a–b and the second pair of opposed surfaces 15a–b each contact the edge of the substrate S and the substrate S is supported thereby.

The clamp-type gripper assembly of FIGS. 2A–B can support a substrate in a vertical orientation regardless of the position of the gripper relative to the substrate. Thus, by turning FIGS. 2A–B to view them from various orientations, one can view various orientations of the gripper assembly 17 which still support a vertically oriented substrate by its edges. The gripper assembly of FIGS. 2A–B are thus easily adaptable to transfer substrates to and from variously configured substrate supports. However, because most vertical substrate supports support a substrate along its lower hemisphere, the gripper assembly 17 is preferably configured with the gripper 19 at a higher elevation than the end effectors 11a–b. Accordingly, to reduce potential substrate contamination, the fingers 21a–b are bent (e.g., as shown in FIGS. 2A–B) to place the gripper 19 to the side of the substrate S (where particles are less likely to travel to the substrates front surface). Although less preferred, the fingers 21a–b may be bent so as to position the gripper 19 to the front, or preferably to the back of the substrate S.

The clamp type gripper assembly of FIGS. 2A–B may be able to pick up a flatted substrate regardless of its orientation, because each of the end effectors 11a–b may be sized so as to be longer than the length of a flat portion of a substrate to be gripped thereby. Accordingly at least three of the pairs of opposed surfaces 13a–b will contact a flatted substrate at any given time. Three points of contact are sufficient to securely grip a substrate.

Figure 3:
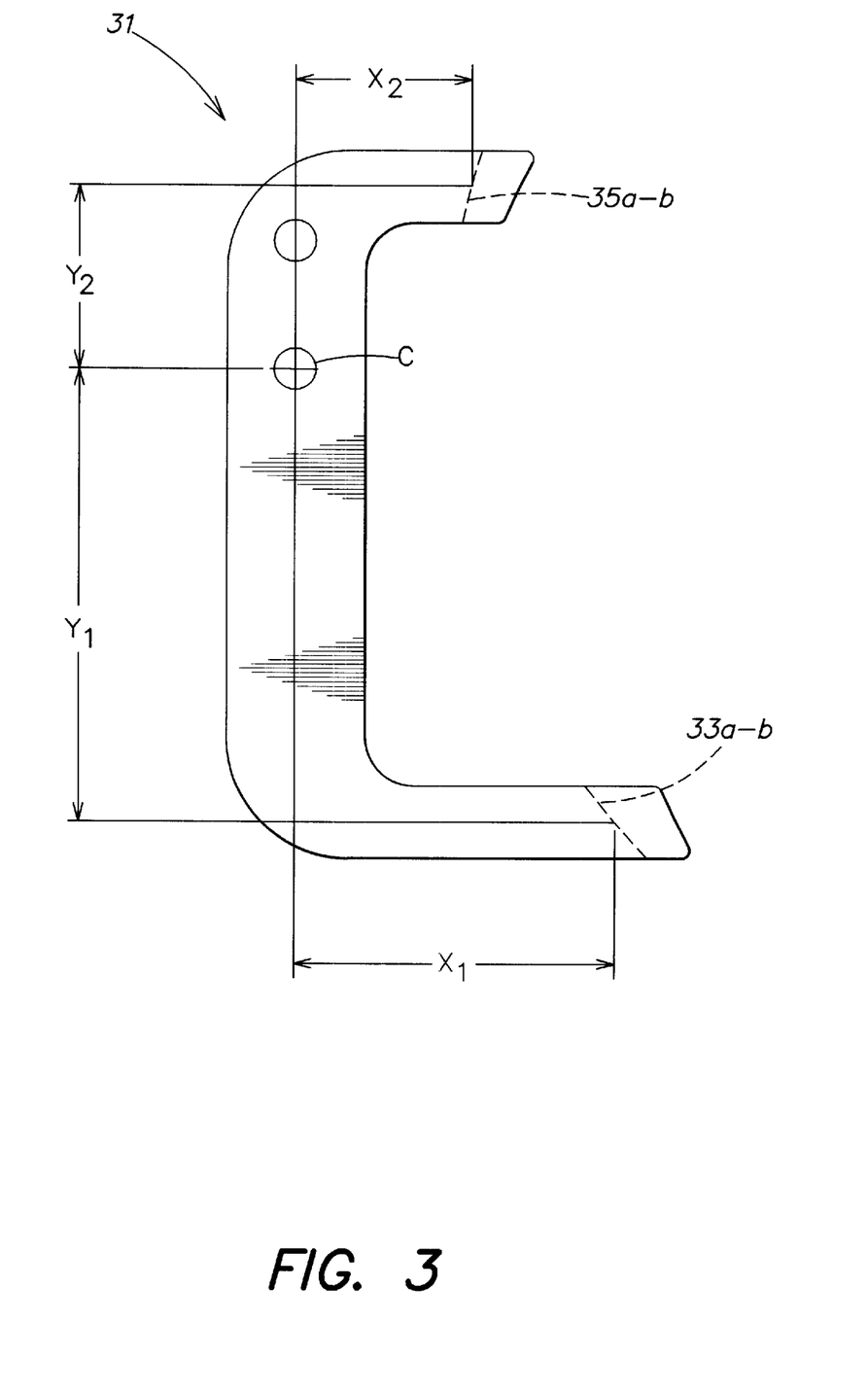
FIG. 3 is a side perspective view of a pocket-type end effector of a second aspect of the inventive gripper assembly.

FIG. 3 is a side perspective view of a pocket-type: end effector 31 of a pocket-type aspect of the inventive gripper assembly. Like the clamp-type end effector 11 of FIG. 1, the pocket-type end effector 31 of FIG. 3 comprises a first and second pair of opposed surfaces, best described with reference to FIGS. 4A–B as a lower pair of opposed surfaces 33a–b adapted to simultaneously contact (e.g., via two opposing points) an edge of a vertically oriented substrate S to be supported thereby. The pocket-type gripper assembly 31 also comprises an upper pair of opposed surfaces 35a–b. However in the embodiment of FIG. 3, the upper pair of opposed surfaces 35a–b are adapted to limit the horizontal movement of a vertically oriented substrate S supported by the lower pair of opposed surfaces 33a–b, rather than to clamp the substrate S. Thus the upper pair of opposed surfaces 35a–b are positioned far enough apart to allow some horizontal movement (both into and out of the page).

Preferably both the lower pair of opposed surfaces 33a–b and the upper pair of opposed surfaces 35a–b comprise a groove adapted to minimize contact with the substrate S's front and back surfaces, such as a "v" shaped groove. Preferably, to deter particles and fluid contaminants from being trapped between the lower pair of opposed surfaces 33a–b and/or the upper pair of opposed surfaces 35a–b and the substrate S, the lower pair of opposed surfaces 33a–b and/or the upper pair of opposed surfaces 35a–b are radiused to mimic the circumference of the wafer, and thus may minimize or eliminate contact with the front or back surface of the wafer and may contact only the beveled. edge of the wafer, as shown in FIG. 3. Further, the lower pair of opposed surfaces 33a–b and the upper pair of opposed surfaces 35a–b are preferably unitary, thereby minimizing moving parts.

The lower pair of opposed surfaces 33a–b preferably extend a further horizontal distance ($X_1$), than do the upper pair of opposed surfaces 35a–b ($X_2$) Similarly, the lower pair of opposed surfaces 33a–b are located a greater vertical distance $Y_1$ from a point C which is to be centered on the substrate S's horizontal diameter, than are the upper pair of opposed surfaces 35a–b ($Y_2$).

In this configuration a pair of pocket-type end effectors 31a–b can close when positioned along a narrower portion of the substrate S (e.g., below the elevation at which the lower pairs of opposed surfaces 33a–b contact the substrate S). Thus, when the end effectors 31a–b elevate, the upper pair of opposed surfaces 35a–b (which do not extend inwardly as far as the lower pair of opposed surfaces 33a–b) will not contact the substrate S, as described further with reference to FIGS. 4A–B. Alternatively, much like the clamp-type end effectors of FIGS. 2A–B, the pocket-type end effectors may open and close around the substrate S from an elevation at which the lower pair of opposed surfaces will contact the substrate S when in the closed position.

Figure 4A:
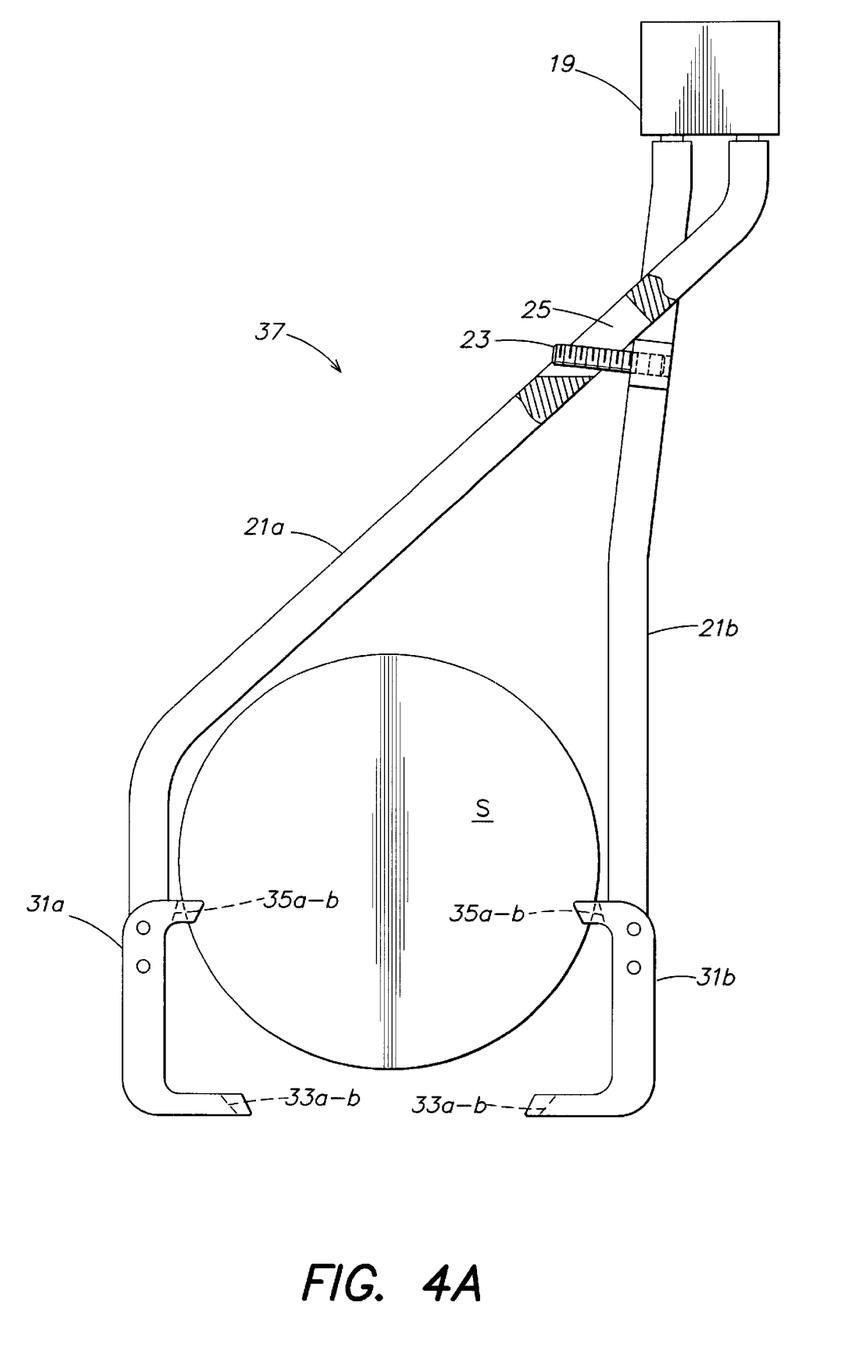
FIGS. 4A–B are front elevational views of a gripper assembly employing the pocket-type end effector of FIG. 3, showing the gripper assembly in a closed no-substrate-contact position and a closed substrate-contact position, respectively.
Figure 4B:
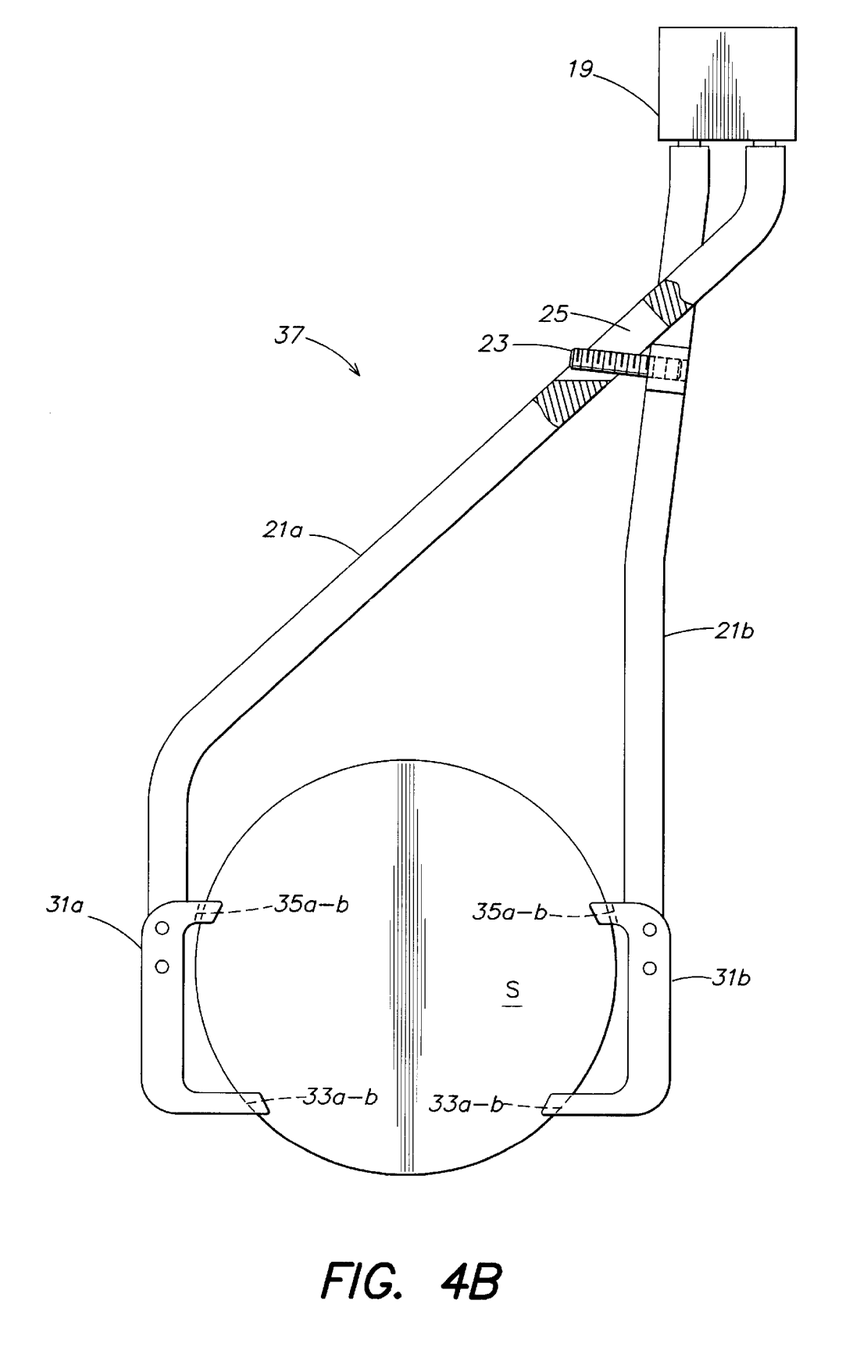

FIGS. 4A–B are front elevational views of a gripper assembly 37 employing a pair of the end effectors of FIG. 3 and showing the gripper assembly in a closed no-substrate-contact position and closed substrate-contact position, respectively. Aside from the pocket-type end effectors 31a–b, the gripper assembly 37 of FIGS. 4A–B is identical to the gripper assembly 17 of FIGS. 2A–B. Accordingly, the description thereof is not repeated with reference to FIGS. 4A–B.

In operation a substrate handler (not shown) having the gripper assembly 37 coupled thereto, lowers the gripper assembly 37 to an elevation below an elevation at which the lower pair of opposed surfaces 33a–b would intersect the substrate S when in the closed position. Thereafter, if the gripper assembly 37 is not already closed, the gripper assembly 37 assumes the closed position such that the upper pair of opposed surfaces 35a–b close around the substrate S, but do not contact the substrate S (FIG. 4A). The substrate handler (not shown) then elevates the gripper assembly 37 causing the lower pair of opposed surfaces 33a–b to gently contact and support the substrate S in a pocket-like manner (FIG. 4B). The force exerted between the substrate S and the lower pair of opposed surfaces 33a–b preferably is purely vertical and thus particle generation is minimized. During substrate pick-up and transport, the. upper pair of opposed surfaces 35a–b (which are further apart than the thickness of the substrate S's edge) do not contact the substrate S unless the substrate S tilts horizontally forward or backward.

Figure 5:
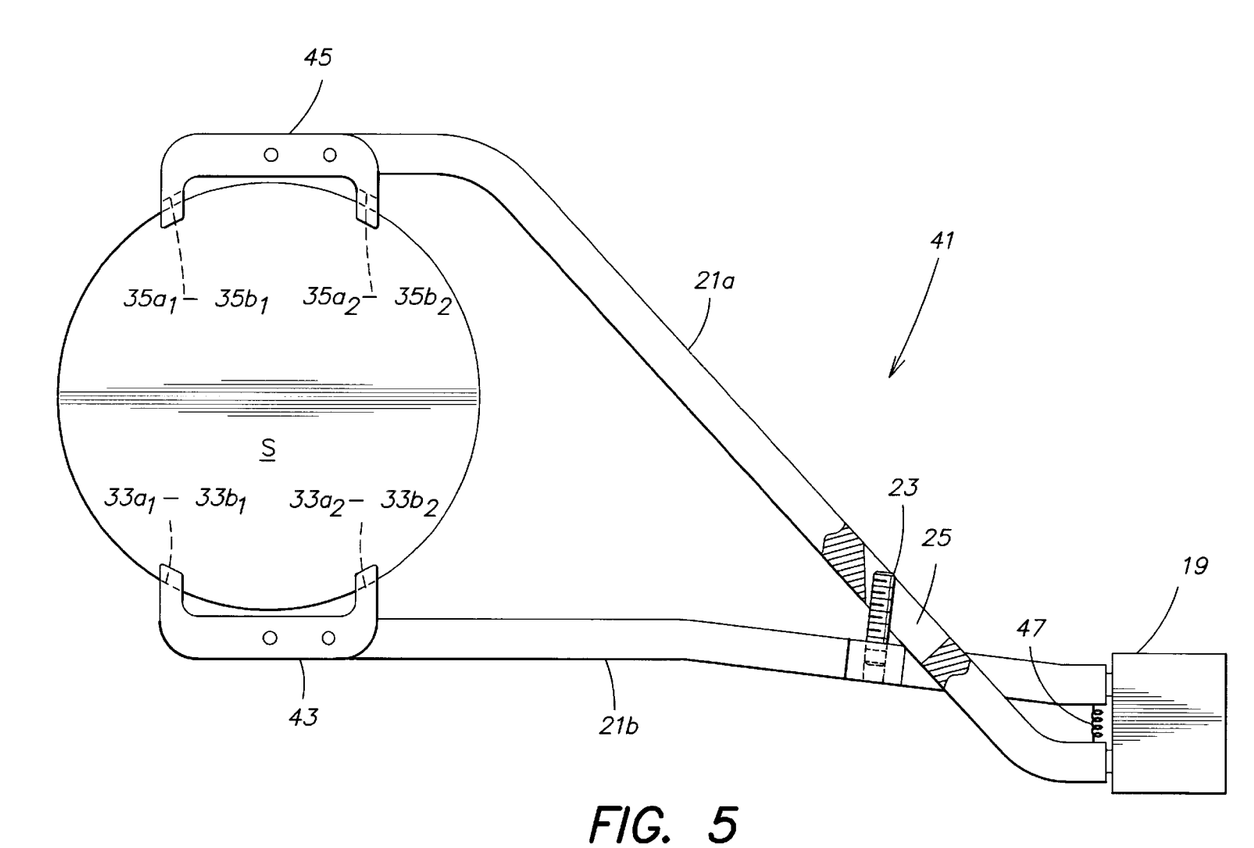
FIG. 5 is a front elevational view of an alternative pocket-type gripper assembly.

FIG. 5 is a front elevational view of an alternative pocket-type gripper assembly 41. The pocket-type gripper assembly 41 is oriented such that the gripper 19 is positioned beside the substrate S. Aside from a bottom end effector 43 and a top end effector 45 the remainder of the gripper assembly 41 comprises components like those of FIGS. 1–4B. Accordingly, only those aspects of the gripper assembly 41 which differ from the gripper assemblies 17 and 37 will be described with reference to FIG. 5. Specifically, the bottom end effector 43 is positioned such that the first and second pair of opposed surfaces $33a_1$–$b_1$, $33a_2$–$b_2$ are in a horizontal line. The first and second pair of opposed surfaces $33a_1$–$b_1$, $33a_2$–$b_2$ are configured such that both opposing surfaces simultaneously contact the substrate S to thereby support the substrate S. The top end effector 45 is also positioned such that the first and second pair of opposed surfaces $35a_1$–$b_1$, $35a_2$–$b_2$ are in a horizontal line. However, the first and second pair of opposed surfaces $35a_1$–$b_1$, $35a_2$–$b_2$ of the top end effector 45 are configured like the upper pairs of opposed surfaces $35a$–$b$ of FIGS. 4A–B. Specifically, the first and second pair of opposed surfaces $35a_1$–$b_1$, $35a_1$–$b_1$ of the top end effector 45 are adapted to limit the horizontal movement of a vertically oriented substrate S supported by the bottom end effector 43.

In operation the gripper assembly 41 assumes an open position and moves to position the center points C of the top and bottom end effector 43, 45 along the vertical diameter of the substrate S and then closes, as shown in FIG. 5. As the gripper assembly 41 closes, the bottom end effector 43 gently contacts the substrate S and lifts it from the substrate support (not shown), and the top end effector 45 lowers to an elevation wherein the opposed surfaces thereof limit the horizontal movement of the substrate S but do not clamp the substrate S (e.g., to an elevation wherein the substrate S is not inserted far enough within the groove formed by the opposed surfaces to contact the edges thereof, unless the substrate moves horizontally forward or backward).

Figure 6:
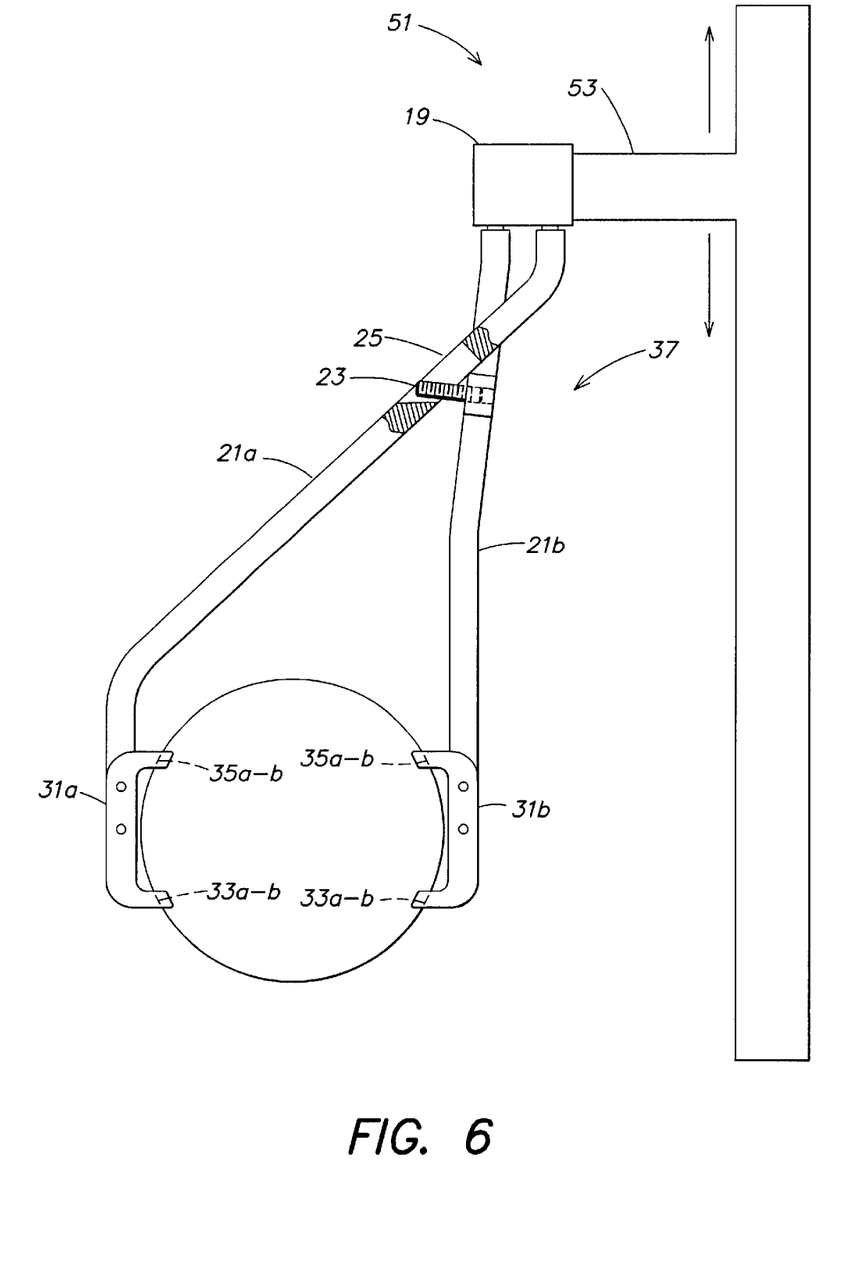
FIG. 6 is a schematic side view of a substrate handler that includes the gripper assembly of FIGS. 4A–B.

The gripper of each of the gripper assemblies 17, 37 and 41, preferably are normally biased to a closed position (e.g., via a spring 47 shown in FIG. 5). Thus, in the event a power failure occurs while the gripper assembly 17, 37, 41 supports a substrate S, the gripper assembly maintains its closed position and does not drop the substrate S. Also, each of the gripper assemblies 17, 37 and 41, may be advantageously coupled to a substrate handler 51 having a moveable arm 53 for lifting and lowering the gripper assembly as shown in the schematic side view of FIG. 6. Such a wafer handler may be advantageously used with the end effectors described herein, and particularly with the pocket type end effectors. Thus, as shown in FIG. 6, the gripper is at an elevation higher than that of the end effectors, and at least one of the fingers is bent so that the gripper is not above the substrate supported by the end effectors.

The foregoing description discloses only the preferred embodiments of the invention, modifications of the above disclosed apparatus and method which fall within the scope of the invention will be readily apparent to those of ordinary skill in the art. For instance, as previously mentioned, the end effectors 11 and/or 31, rather than being unitary, may comprise moving parts which move the opposing surfaces horizontally together and apart, so as to selectively contact the substrate S. Further, although both the clamp-type and pocket-type end effectors are preferably positioned along the diameter of the substrate S, other positions will also support the substrate. Of course, for both types of end effectors the lengths of the upper and lower pairs of opposed surfaces will vary according to the position at which they contact the substrate. The opposed surfaces need not be v-shaped, any pair of surfaces which can support the substrate may be employed. Thus, the invention encompasses any gripper assembly which clamps or pockets a vertically oriented substrate by contacting the substrate's edges.

Further, the clamp type end effectors may be advantageously employed for gripping other, non-vertically oriented substrates (e.g., horizontal, etc.). In such embodiments the substrate need not slide relative to the end effectors (e.g., relative to a bottom plate of the end effector) as may occur in conventional horizontal end effectors. Specifically the inventive end effectors are each mounted to an individual gripper finger which may move the respective end effector in a "tong" like motion rather than a pushing/sliding motion.

The gripper actuators and gripper finger configurations disclosed herein are merely exemplary. The gripper fingers need not cross, as shown herein, and the gripper actuators may comprise scissors type actuators, sliding type actuators, etc.

Accordingly, while the present invention has been disclosed in connection with the preferred embodiments thereof, it should be understood that other embodiments may fall within the spirit and scope of the invention, as defined by the following claims.

What is claimed is:

1. A method of handling a vertically oriented substrate, comprising:

positioning on opposite sides of a vertically oriented substrate, a pair of end effectors each having an upper pair of opposed surfaces and each having a lower pair of opposed surfaces adapted to support a vertically oriented substrate;

moving the end effectors to an elevation below an elevation at which the lower pair of opposed surfaces intersect the substrate; and elevating the pair of end effectors such that the lower pair of opposed surfaces of the end effectors contact and support the substrate via the substrate's edges without bringing the upper pair of opposed surfaces of the end effectors into contact with the substrate.

2. The method of claim 1 further comprising moving the pair of end effectors to a closed position while at the elevation below the elevation at which the lower pair of opposed surfaces of the end effector contact and support the substrate.

3. The method of claim 1 wherein elevating the pair of end effectors such that the lower pair of opposed surfaces of the end effectors contact and support the substrate comprises contacting the substrate with a force comprising a vertical component.

4. The method of claim 2 wherein elevating the pair of end effectors such that the lower pair of opposed surfaces of the end effectors contact and support the substrate comprises contacting the substrate with a force comprising a vertical component.

5. The method of claim 3 further comprising allowing a range of substrate movement in a horizontal plane via the upper pair of opposed surfaces.

6. The method of claim 5 wherein contacting and supporting the substrate with the lower pair of opposed surfaces comprises contacting the substrate with a groove adapted to contact the substrate at two opposing points.

7. The method of claim 1 further comprising allowing a range of substrate movement in a horizontal plane via the upper pair of opposed surfaces.

8. The method of claim 7 wherein contacting and supporting the substrate with the lower pair of opposed surfaces comprises contacting the substrate with a groove adapted to contact the substrate at two opposing points.

9. A gripper assembly comprising:
   a gripper;
   a pair of fingers operatively coupled to the gripper; and
   a pair of end effectors coupled to ends of the fingers and adapted to support a vertically oriented substrate therebetween, each end effector comprising:
      a lower pair of opposed surfaces adapted to simultaneously contact an edge of a vertically oriented substrate to be supported by the end effectors; and
      an upper pair of opposed surfaces adapted to allow a range of horizontal movement of a vertically oriented substrate supported by the end effectors;
      wherein the fingers are movably linked to each other at a point between the gripper and the ends of fingers.

10. The apparatus of claim 9 wherein the lower pair of opposed surfaces comprises a unitary groove adapted to contact the substrate at two points.

11. The apparatus of claim 10 wherein the lower pair of opposed surfaces are radiused to mimic a circumference of a substrate to be supported thereby.

12. The apparatus of claim 10 wherein the upper pair of opposed surfaces comprises a unitary groove within which the substrate may move horizontally.

13. The apparatus of claim 12 wherein the upper pair of opposed surfaces are radiused to mimic a circumference of a substrate to be supported thereby.

14. The apparatus of claim 13 wherein the lower pair of opposed surfaces are radiused to mimic a circumference of a substrate to be supported thereby.

15. The apparatus of claim 12 wherein the lower pair of opposed surfaces are radiused to mimic a circumference of a substrate to be supported thereby.

16. The apparatus of claim 9 wherein the upper and lower pairs of opposed surfaces each comprises a unitary groove, and wherein the gripper is adapted to move the fingers between an open position wherein the end effectors are further apart than the diameter of a substrate to be supported therebetween, and a closed position wherein the end effectors are positioned to pocket a substrate therebetween.

17. The apparatus of claim 16 further comprising a biasing mechanism adapted to bias the gripper in a normally closed position.

18. A gripper assembly comprising:
   a gripper;
   a pair of fingers operatively coupled to the A gripper; and
   gripper; and a pair of end effectors coupled to ends of the fingers and adapted to support a vertically oriented substrate therebetween, each end effector comprising:
      a first pair of opposed surfaces adapted to simultaneously contact an edge of a vertically oriented substrate to be supported by the end effectors; and
      a second pair of opposed surfaces adapted to. simultaneously contact the edge of a vertically oriented substrate to be supported by the end effectors;
      wherein the fingers are movably linked to each other at a point between the gripper and the ends of the fingers;
      wherein the first pair of opposed surfaces comprise a unitary groove adapted to contact the substrate at two points.

19. The apparatus of claim 18 wherein the first pair of opposed surfaces are radiused to mimic a circumference of a substrate to be supported thereby.

20. The apparatus of claim 18 wherein the second pair of opposed surfaces comprise a unitary groove adapted to contact the substrate at two points.

21. The apparatus of claim 20 wherein the second pair of opposed surfaces are radiused to mimic a circumference of a substrate to be supported thereby.

22. The apparatus of claim 18 wherein the second pair of opposed surfaces comprises a unitary groove, and wherein the gripper is adapted to move the fingers between an open position wherein the end effectors are further apart then the diameter of a substrate to be supported therebetween, and a closed position wherein the end effectors are positioned to clamp a substrate therebetween.

23. The apparatus of claim 22 wherein the gripper is biased in a normally closed position.

24. A substrate handler, comprising:
   a moveable arm capable of lifting and lowering; and
   the apparatus of claim 22 coupled to an end of the moveable arm.

* * * * *